(12) United States Patent
Masleid et al.

(10) Patent No.: US 9,543,243 B2
(45) Date of Patent: Jan. 10, 2017

(54) LOW-NOISE ARRANGEMENT FOR VERY-LARGE-SCALE INTEGRATION DIFFERENTIAL INPUT/OUTPUT STRUCTURES

(71) Applicant: ORACLE INTERNATIONAL CORPORATION, Redwood City, CA (US)

(72) Inventors: Robert P. Masleid, Monte Sereno, CA (US); Donald Arthur Draper, Santa Clara, CA (US); Eben Kunz, Santa Clara, CA (US); Laura Kocubinski, Santa Clara, CA (US)

(73) Assignee: Oracle International Corporation, Redwood City, CA (US)

( * ) Notice: Subject to any disclaimer, the term of this patent is extended or adjusted under 35 U.S.C. 154(b) by 155 days.

(21) Appl. No.: 14/536,188

(22) Filed: Nov. 7, 2014

(65) Prior Publication Data
US 2016/0134262 A1    May 12, 2016

(51) Int. Cl.
*H01L 23/52* (2006.01)
*H01L 23/522* (2006.01)
*H01L 23/00* (2006.01)

(52) U.S. Cl.
CPC .......... *H01L 23/5226* (2013.01); *H01L 24/17* (2013.01); *H01L 24/49* (2013.01)

(58) Field of Classification Search
CPC ....... H01L 23/5226; H01L 24/17; H01L 24/49
See application file for complete search history.

(56) References Cited

U.S. PATENT DOCUMENTS

| | | | | |
|---|---|---|---|---|
| 7,347,701 B2* | 3/2008 | Daly | ................. | H01R 43/0249 439/68 |
| 8,294,259 B2* | 10/2012 | Jiang | ...................... | H01L 23/50 257/697 |
| 9,089,060 B1* | 7/2015 | Azeroual | ............... | H05K 1/114 |

* cited by examiner

*Primary Examiner* — Jeffrey Zweizig
(74) *Attorney, Agent, or Firm* — Marsh Fischmann & Breyfogle LLP; Daniel J. Sherwinter

(57) ABSTRACT

Embodiments of the invention provide low-noise arrangements for very-large-scale integration (VLSI) differential input/output (I/O) structures (I/O pins, solder bumps, vias, etc.). Novel geometries are described for arranging differential pairs of I/O structures in perpendicular or near-perpendicular "quads." The geometries effectively place one differential pair on or near the perpendicular bisector of its adjacent differential pair, such that field cancellation and differential reception can substantially eliminate noise without the need for added spacing or shields. By exploiting these effects, embodiments can suppress noise, independent of I/O structure spacing, and arbitrarily small spacings are permitted. Such arrangements can be extended into running chains, and even further into arrays of parallel chains. The parallel chains can be separated by supply structures (e.g., power supply bumps, or the like), and such supply structures can supply power to the I/O circuits of the IC, while also shielding adjacent chains from each other.

20 Claims, 8 Drawing Sheets

LOW-NOISE ARRANGEMENT FOR VERY-LARGE-SCALE INTEGRATION DIFFERENTIAL INPUT/OUTPUT STRUCTURES

BACKGROUND

Embodiments relate generally to very-large-scale integration (VLSI) integrated circuits, and, more particularly, to low-noise arrangements for VLSI differential input/output (I/O) structures.

Integrated circuits are becoming increasingly complex. For example, in VLSI integrated circuit (IC) design, there has been a trend towards increasing die sizes, numbers of circuits, compaction of circuits, etc. Such increases tend to increase the complexity of interfacing with those ICs. For example, interfacing with higher numbers and densities of signals being communicated to and from the circuits of the IC can involve higher numbers and densities of pins, solder bumps, and/or other vertical I/O structures.

Often, there is also a desire to operate ICs with high signal integrity, which can be difficult with large numbers of densely arranged I/O structures. For example, many I/O signals can be communicated as differential signals (e.g., by pairs of pins), which can permit more noise tolerance because much of the noise can be common mode and can be rejected by a receiver having good common-mode rejection properties. However, densely arranged I/O structures can experience appreciable amounts of coupling (e.g., cross talk) from adjacent I/O structures, and such coupling can increase at higher frequencies.

BRIEF SUMMARY

Among other things, systems and methods are described for providing low-noise arrangements for VLSI differential input/output (I/O) structures. The I/O structures can include I/O pins, solder bumps, ball grid array (BGA) solder balls, vias, and/or other physical (e.g., vertical) structures of an integrated circuit (IC) that carry differential signals or supply levels to and/or from circuits of the IC. Novel perpendicular quad (PNQ) and triangular quad (TNQ) geometries are described for arranging differential pairs of I/O structures in perpendicular or near-perpendicular "quads." The geometries effectively place one differential pair on or near the perpendicular bisector of its adjacent differential pair, such that field cancellation and differential reception can substantially eliminate noise without the need for added spacing or shields. By exploiting these effects, embodiments can suppress noise, independent of I/O structure spacing, and arbitrarily small spacings are permitted. Such arrangements can be extended into running chains, and even further into arrays of parallel chains. The parallel chains can be separated by supply structures (e.g., power supply bumps, or the like), and such supply structures can supply power to the I/O circuits of the IC, while also shielding adjacent chains from each other.

According to one set of embodiments, an integrated circuit is provided. The integrated circuit includes a two-dimensional arrangement of input/output (I/O) structures. The arrangement has: first and second I/O structures that are adjacent to each other and are electrically coupled with the integrated circuit so as to jointly carry a first differential signal; and third and fourth I/O structures that are adjacent to each other and are electrically coupled with the integrated circuit so as to jointly carry a second differential signal, the third and fourth I/O structures being adjacent to and equidistant from the second I/O structure.

According to another set of embodiments, another integrated circuit is provided. The integrated circuit includes: a package; a number of circuits integrated into the package and disposed to communicate a plurality of differential signals; and a two-dimensional array of vertical input/output (I/O) structures integrated with the package and the circuits, the array having signal rows of arrangement instances. Each arrangement instance has: first and second I/O structures that are adjacent to each other and are electrically coupled with the circuits so as to jointly communicate a first of the differential signals; and third and fourth I/O structures that are adjacent to each other and are electrically coupled with the circuits so as to jointly communicate a second of the differential signals, the third and fourth I/O structures being adjacent to and equidistant from the second I/O structure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
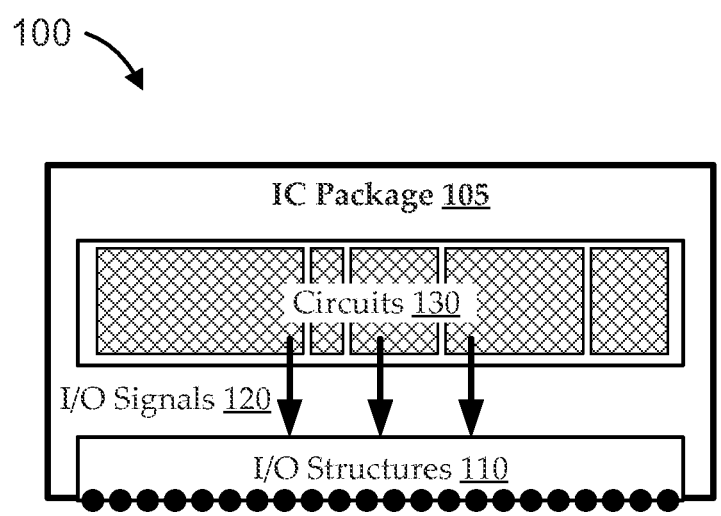
FIG. 1 shows an illustrative simplified view of a very-large-scale integration integrated circuit.

For the sake of context, FIG. 1 shows an illustrative simplified view of a very-large-scale integration (VLSI)

integrated circuit (IC) 100. The IC 100 includes a number of circuits 130. Various ones of the circuits 130 can transmit and/or receive various types of signals, including I/O signals 120. The I/O signals 120 can be communicated between the circuits 130 of the IC 100 and systems external to the IC 100 (e.g., other circuits, etc.) via I/O structures 110. As used herein, the term "I/O structure" is intended to broadly refer to any suitable interface structure for an IC, including, for example, I/O pins, ball grid array (BGA) and/or other solder bumps, vias, and/or other vertical structures. Further, as used herein, the term "integrated circuit" or "IC" is intended to broadly include any type of system experiencing cross talk of other types of undesirable coupling between adjacent I/O structures 110. Some such ICs 100 are integrated into a package 105, as shown.

Increasing demands on ICs 100 have yielded IC designs with larger die sizes, larger numbers of circuits 130, more compaction of circuits 130, higher numbers and densities of I/O signals 120, etc. Such implementations typically force IC designers to integrate increasing numbers I/O structures 110 into the IC 100, typically at increasing densities. As the numbers and densities of I/O structures 110 increase, there can be more coupling effects between adjacent I/O structures 110. For example, each I/O structure 110 tends to experience more cross talk from its neighbors. Thus, while it is often desirable to operate ICs 100 with high signal integrity, such signal integrity can be difficult to achieve with large numbers of densely arranged I/O structures 110. For example, many I/O signals 120 can be communicated as differential signals (e.g., by pairs of pins), which can permit more tolerance from common mode types of noise by using receivers having good common-mode rejection properties. However, cross talk from adjacent, densely arranged I/O structures 110 does not typically manifest as common mode noise, and cannot be rejected as such. Further, the coupling noise typically increases with higher frequencies.

There are a number of traditional approaches to reducing coupling between adjacent I/O structures 110. One category of traditional approaches involves increasing spacing to reduce near-field coupling effects. For example, physical spacing can be increased (e.g., I/O pins or bumps can be spaced further apart or offset from each other) or signal spacing can be effectively increased (e.g., by carefully assigning signals to I/O pins or bumps in a manner that increases the spacing between potentially interfering I/O signals 120). For the sake of illustration, differential pairs of I/O structures 110 on a VLSI IC 100 are often arranged in parallel rows, so that a common axis of each pair is parallel to an axis of all other pairs. The pairs can be spaced or offset somewhat to reduce coupled noise, and such a layout can permit each I/O cell of the IC 100 to have an identical layout. In such a layout, however, noise coupling is typically not symmetric into a given pair; it is not removed, even if the pair is equipped with a perfect differential receiver.

Figure 2B:
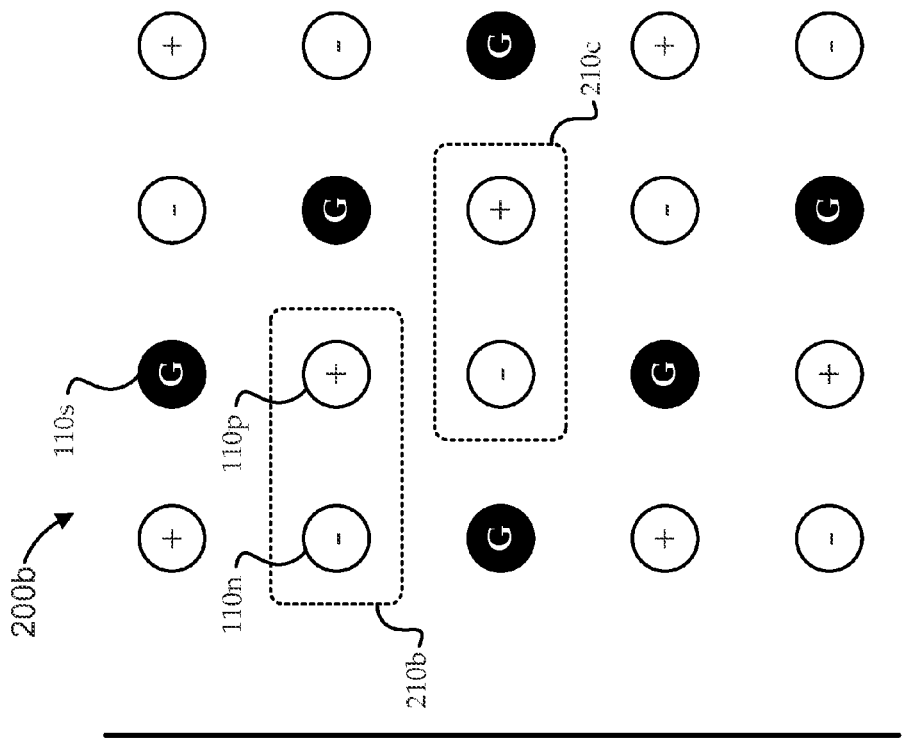
FIGS. 2A and 2B show examples of illustrative approaches to reducing coupling between adjacent I/O structures by adding shielding.
Figure 2A:
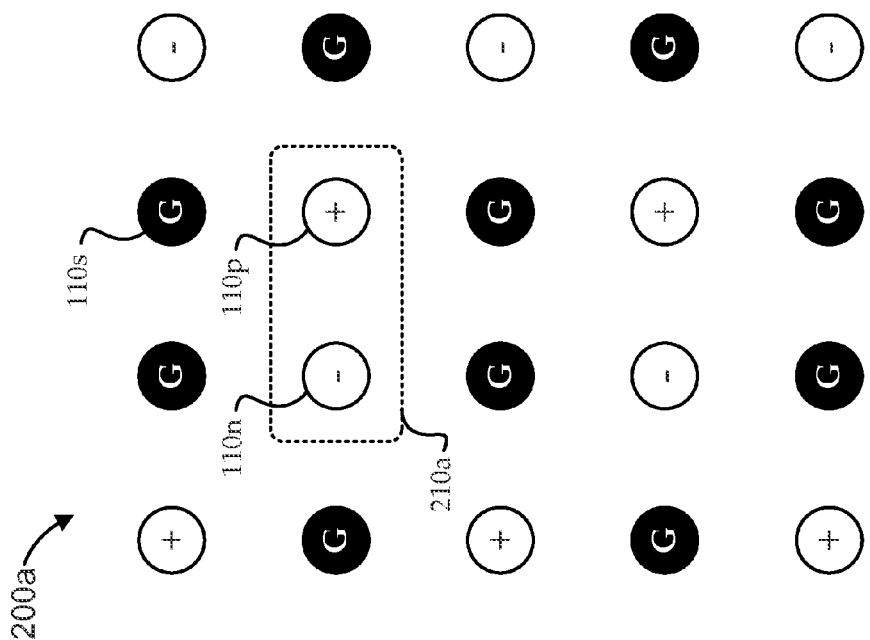

Another category of traditional approaches involves adding shielding. FIGS. 2A and 2B show examples of illustrative approaches 200 to reducing coupling between adjacent I/O structures 110 by adding shielding. Each approach 200 shows an array of I/O structures 110 (e.g., I/O bumps), each assigned as either a "source" structure 110s (in the arrays shown, these are implemented as ground structures, though the supply structures 110s can generally be assigned to any useful source or reference level, such as chassis ground, positive source voltage level, negative voltage source level, etc.), positive differential structure 110p (i.e., coupled with the positive side of a differential I/O signal), or a negative differential structure 110n (i.e., coupled with the negative side of a differential I/O signal). For example, a particular differential I/O signal from a circuit of an IC is assigned to a pair of I/O structures 110, so that an adjacent positive differential structure 110p and negative differential structure 110n together implement a differential pair 210. In both illustrative arrangements, the supply structures 110s are used to shield differential pairs 210 from other differential pairs 210.

In particular, as shown in FIG. 2A, differential pair 210a is surrounded by six supply structures 110s. FIG. 2B shows a different arrangement that uses fewer supply structures 110s for shielding. For example, while there is a potential for cross talk between differential pair 210a and differential pair 210b, such cross talk can be somewhat minimized. First, the supply structures 110s can provide return paths that can suppress at least some of the potential noise coupling. Second, the differential pairs 210 can be arranged so that potentially interfering signals are spaced apart. Notably, while such approaches can be effective in some instances, they can have certain limitations. One limitation is that such approaches tend to increase the number and density of I/O structures 110 by adding supply structures 110s for each differential pair 210. Another limitation is that such approaches can increase complexity by forcing other design constraints, such as spacing out potentially conflicting I/O signals.

Figure 3B:
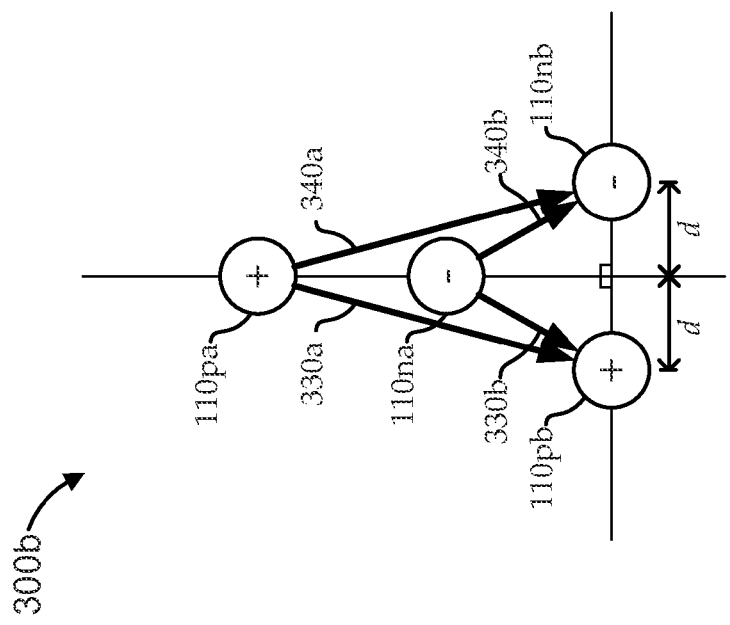
FIGS. 3A and 3B show a prototypical arrangement of differential structures, according to various embodiments.
Figure 3A:
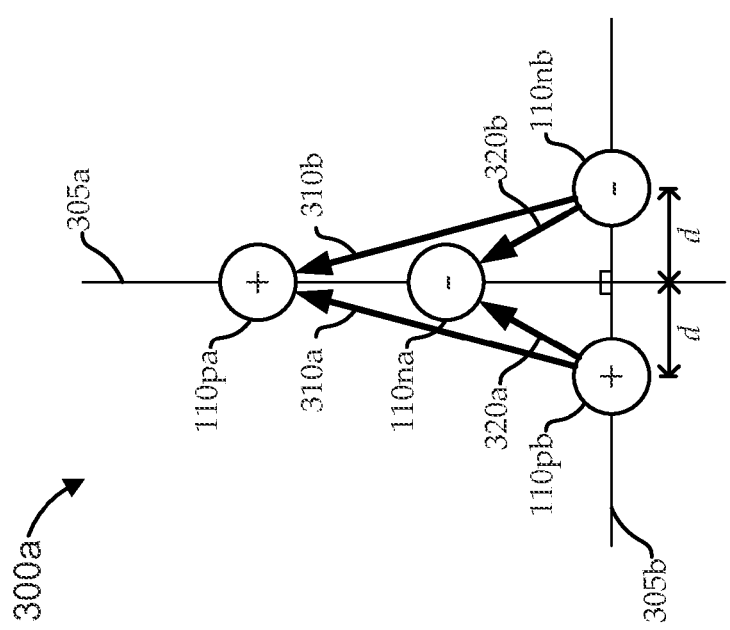

Embodiments can reduce, or even substantially eliminate, noise interference between adjacent differential pairs 210 by exploiting the differential nature of the noise interference. FIGS. 3A and 3B show a prototypical arrangement 300 of differential structures 210, according to various embodiments. As illustrated, a first differential pair is formed by positive differential structure 110pa and negative differential structure 110na, and a second differential pair is formed by positive differential structure 110pb and negative differential structure 110nb. A first axis 305a passes through the centers of the I/O structures 110 of the first differential pair (e.g., or substantially through their centers), and a second axis 305b passes through the centers of the I/O structures 110 of the second differential pair (e.g., or substantially through their centers), and the first axis 305a substantially bisects the second axis 305b. For example, the second axis 305b is shown as perpendicular to the first axis 305a, and each of the positive differential structure 110pb and negative differential structure 110nb of the second differential pair are substantially the same distance from the first axis 305a.

It is assumed that a first I/O signal is communicated via the first differential pair and a second (potentially interfering) I/O signal is communicated via the second differential pair. FIG. 3A illustrates potential interference from the second I/O signal on the first differential pair, and FIG. 3B shows potential interference from the first I/O signal on the second differential pair. By the nature of a differential signal, it is assumed that the signal being communicated on each positive differential structure 110p is the complement of the signal being communicated on the respective negative differential structure 110n of its differential pair. Further, the distance from positive differential structure 110pb to each of the I/O structures 110 of the first differential pair is substantially equivalent to the distance from negative differential structure 110nb to each of the I/O structures 110 of the first differential pair, so that each I/O structure 110 of the second differential pair on the I/O structures 110 of the first differential pair should be substantially the same. Accordingly, as shown in FIG. 3A, all (or at least an appreciable portion) of the signal interference from positive differential structure 110pb on each of positive differential structure 110pa and negative differential structure 110na will be substantially complementary to the signal interference from negative differential structure 110nb on each of positive differential structure 110pa and negative differential structure 110na, such that the differential interference will effectively cancel out. In this way, substantially all the interference from the second differential pair on the first differential pair can be eliminated (or substantially eliminated) without adding space between I/O structures 110, without adding shielding structures (e.g., supply structures), etc.

Turning to FIG. 3B, it is again assumed that the signal being communicated on each positive differential structure 110p is the complement of the signal being communicated on the respective negative differential structure 110n of its differential pair. Further, the distance from positive differential structure 110pa is substantially the same to each of the I/O structures 110 of the second differential pair, and the distance from negative differential structure 110ns is substantially the same to each of the I/O structures 110 of the second differential pair, so that each I/O structure 110 of the first differential pair will have substantially the same interference impact on both I/O structures 110 of the second differential pair. For example, interference from positive differential structure 110pa will manifest substantially equivalently on positive differential structure 110pb and negative differential structure 110nb; and interference from negative differential structure 110na will manifest substantially equivalently on positive differential structure 110pb and negative differential structure 110nb. Accordingly, the net impact of the interference from the first differential pair on the second differential pair manifests as a common mode fluctuation in the second differential pair. Assuming that each differential pair has sufficient common mode rejection capabilities (e.g., each is coupled with a differential receiver having good common mode rejection properties), the I/O structures 110 of the second differential pair can reject the common mode effects of the interference. In this way, substantially all the interference from the first differential pair on the second differential pair can be eliminated without adding space between I/O structures 110, without adding shielding structures (e.g., supply structures), etc.

While a purely differential signal in the I/O structures 110 of the first differential pair can cause common mode noise in the I/O structures 110 of the second differential pair (to be rejected by the receiver), common mode noise in the I/O structures 110 of the first differential pair also only causes further common mode noise in the I/O structures 110 of the second differential pair; neither causes differential mode noise. This can be in contrast to traditional configurations, such as the one illustrated in FIG. 2B, where differential mode and common mode signals in the I/O structures 110 of the first differential pair cause differential mode noise in the I/O structures 110 of the second differential pair, which cannot be rejected by the receiver.

The arrangement 300 shown in FIGS. 3A and 3B can effectively be seen as an illustrative "quad" that rearranges differential pairs of I/O structures 110 into substantially perpendicular dipoles. Perpendicular arrangements, like the ones shown in FIGS. 3A and 3B, can be referred to as PNQ (PerpeNdicular Quads), while other arrangements that use a close-to-perpendicular arrangement, as described below, can be referred to as TNQ (TriaNgular Quads). Each type of quad effectively places one differential pair on or near the perpendicular bisector of its adjacent differential pair. As described above, in such arrangements, field cancellation and differential reception can substantially eliminate noise without the need for added spacing or shields (note that the symmetrical arrangement of the PNQ can effectively eliminate the noise, while the slightly asymmetrical arrangement of the TNQ minimizes, or substantially eliminates, the noise). By exploiting these effects, embodiments can suppress noise, independent of I/O structure 110 spacing, and arbitrarily small spacings are permitted. As described more fully below, such arrangements can be extended into running chains (e.g., without necessarily adding shields within the chains). The arrangements can be further extended into arrays of parallel chains (and/or other macro structures). The parallel chains can be separated by supply structures (e.g., power supply bumps, or the like). Such supply structures can serve a dual purpose: they can supply power to the I/O circuits of the IC, and they can shield adjacent chains from each other.

Figure 4:
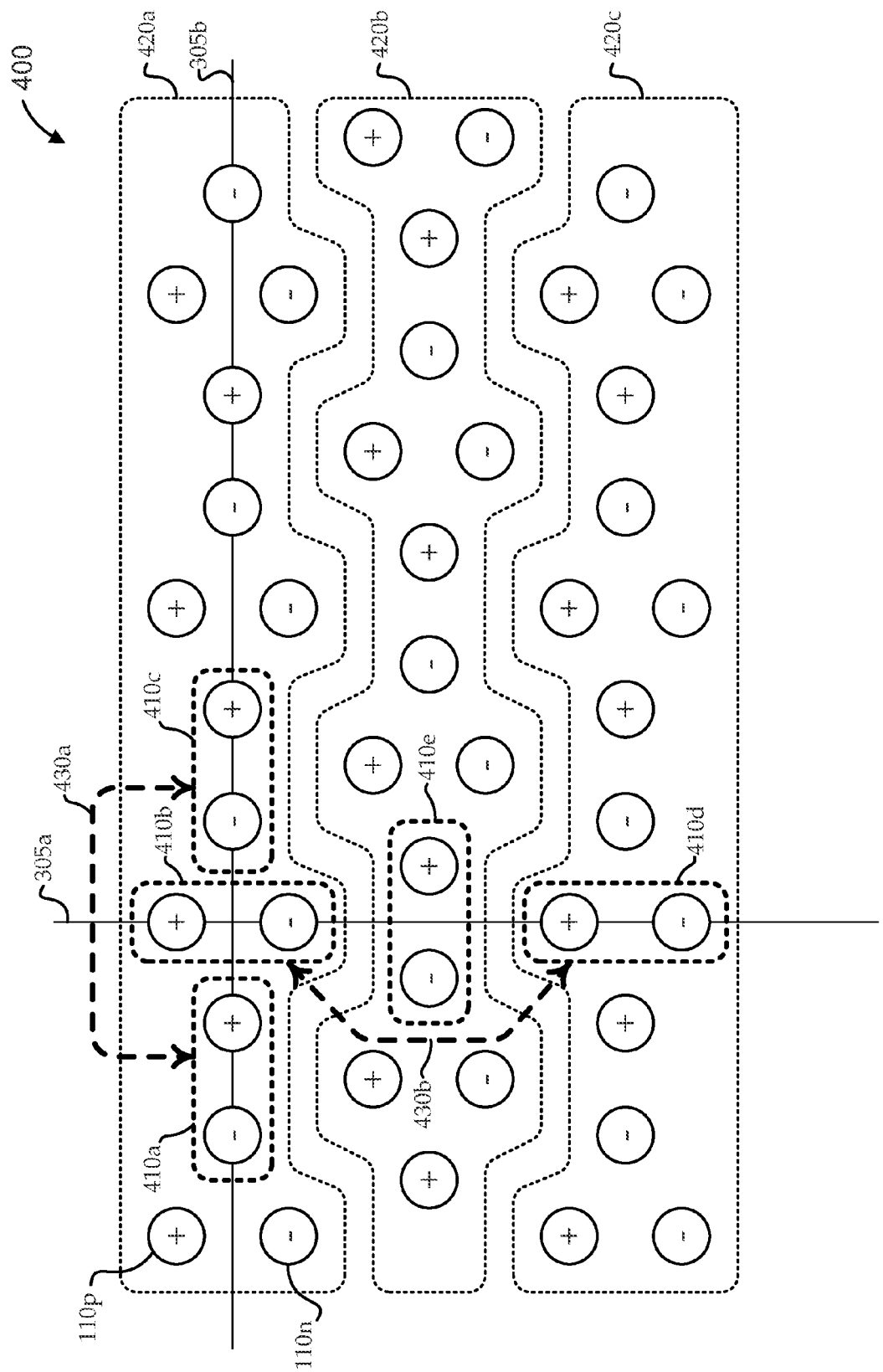
FIG. 4 shows an illustrative partial array of I/O structures that arranges perpendicular quads into parallel chains, according to various embodiments.

FIG. 4 shows an illustrative partial array 400 of I/O structures 110 that arranges perpendicular quads (PNQs) into parallel chains 420, according to various embodiments. As described with reference to FIG. 3, sets of differential pairs can be seen as a quad, shown here as PNQs. The PNQs can be extended into chains 420. For example, differential pairs 410a and 410b can be seen as a PNQ, as can differential pairs 410b and 410c. Each differential pair 410 has a noise mitigating impact on each of its adjacent differential pairs 410 in its chain 420. As illustrated, the parallel chains 420 can be offset to further the PNQ effects, as the offset can effectively form PNQs with differential pairs 410 from adjacent chains 420. For example, in the illustrated array 400, differential pairs 410b and 410e can be seen as a PNQ, as can differential pairs 410d and 410e, as each effectively includes a perpendicular dipole arrangement of differential pairs 410 (i.e., each has one differential pair 410 arranged on an axis 305 that substantially bisects the axis of the other differential pair 410 of its PNQ). Even with the interference mitigation of the PNQ arrangements, there can still be weak coupling between non-adjacent differential pairs 410. For example, arrow 430a illustrates weak coupling between differential pairs 410a and 410c, and arrow 430b illustrates weak coupling between differential pairs 410b and 410d (of course, each differential pair 410 can theoretically contribute some noise to every other differential pair 410, but the magnitude of those effects falls off quickly over distance, and can typically be treated as negligent with respect to almost all non-adjacent differential pairs 410).

Figure 5:
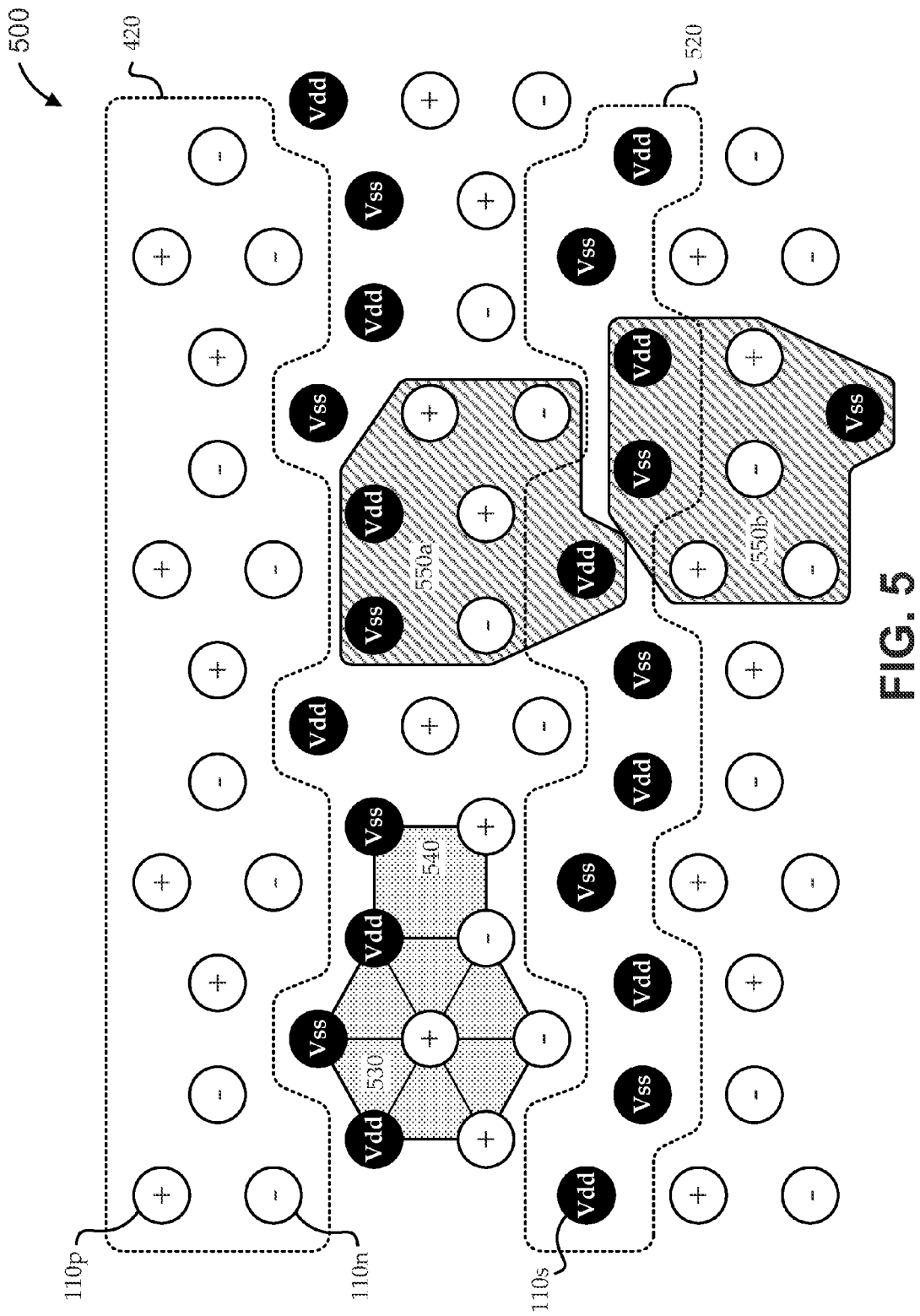
FIG. 5 shows an illustrative partial array of I/O structures that arranges perpendicular quads into parallel chains with supply structures, according to various embodiments.

FIG. 5 shows an illustrative partial array 500 of I/O structures 110 that arranges perpendicular quads (PNQs) into parallel chains 420 with supply structures 110s, according to various embodiments. The array 500 includes signal chains 420 of I/O structures 110 arranged as PNQs, for example, as described with respect to FIG. 4. Each signal chain 420 is separated by a supply chain 520 of supply structures 110s. For example, the chains are arranged so that there are effectively three supply structures 110s for every four signal structures (i.e., each quad of differential pairs, each having a respective positive differential structure 110p and a respective negative differential structure 110n). In some implementations, the supply structures 110s can alternate between positive and negative supply assignments (labeled "Vss" and "Vdd"). For example, each PNQ can effectively be adjacent to two positive supply structures 110s and one negative supply structure 110s, or two negative supply structures 110s and one positive supply structure 110s, as illustrated by groups 550a and 550b.

As illustrated, the array 500 is laid out in substantially perfect triangles 530 and squares 540 (a "Square-and-triangle" or "S&T" layout). For example, a 150 u ("u" refers to a standard pitch unit) pitch can be maintained throughout with the I/O structures 110 arranged to form 150 u equilateral triangles 530 and 150 u squares 540. The triangles 530 can combine, so that sets of six triangles 530 form hexagons; and hexagons can be spaced so that triangles 530 and squares 540 effectively combine (i.e., half of the hexagon manifests 3×60°=180°, half of the square manifests+2× 90°=180°, and 180°+180°=360°). Such arrangements can allow S&T layouts to be snapped into greater chip power template grid positions, or the like, to facilitate implementation within a standard IC configuration (e.g., all I/O structures 110 can be spaced with a consistent center-to-center distance to meet certain design rules). For example, such arrangements can be implemented in a standard 36-pair or 54-pair I/O PHY layout.

Similar to the array 400 of FIG. 4, the array 500 of FIG. 5 exploits the PNQ arrangement to mitigate effects of cross talk between adjacent differential pairs. The array 500 of FIG. 5 provides at least two additional features over that of FIG. 4. First, the array 500 includes a distribution of supply structures 110s across the array 500, which can help facilitate supply connections, where desired. Second, the supply chains 520 can help further mitigate interference between signal chains 420.

Figure 6:
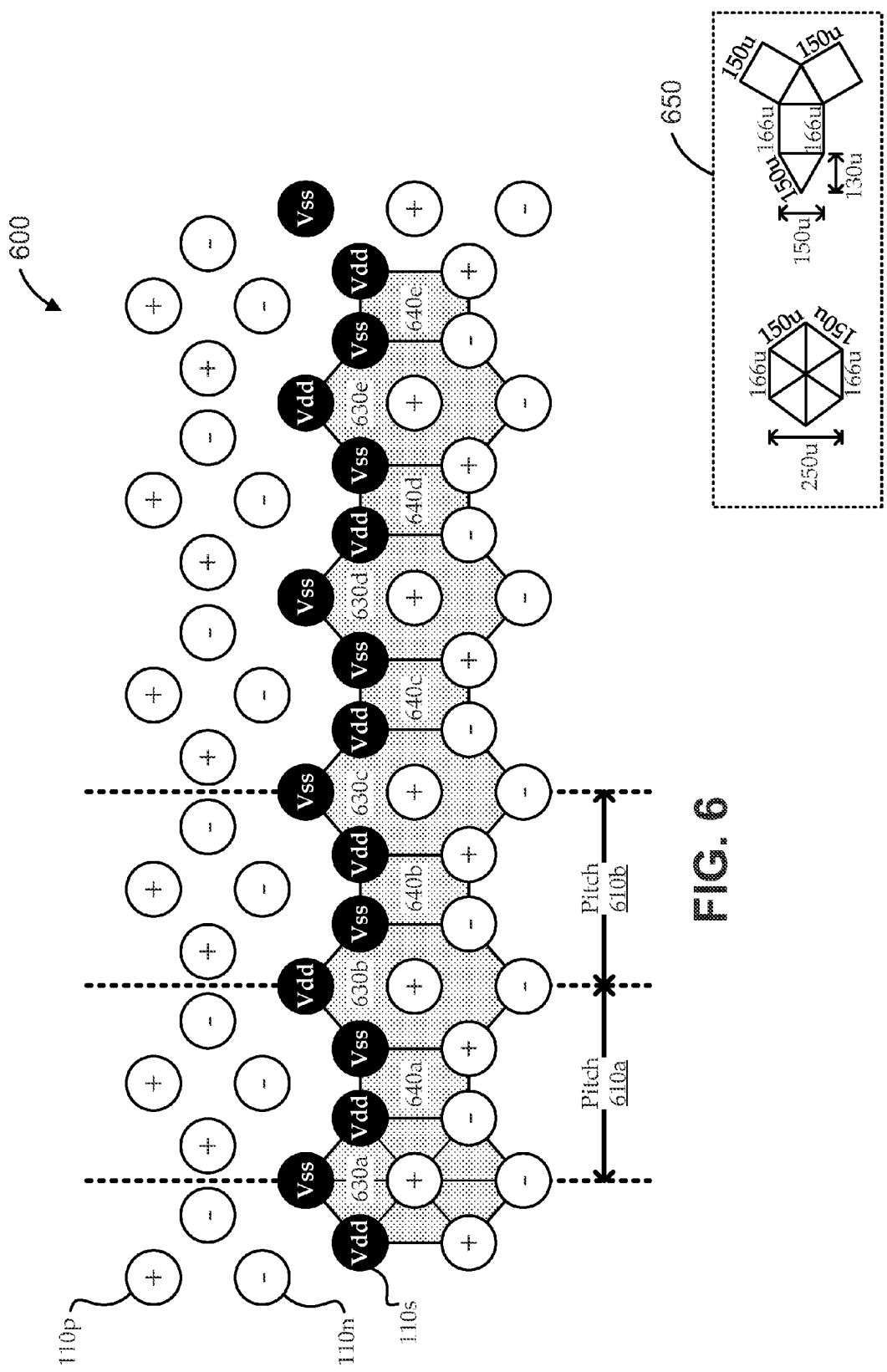
FIG. 6 shows an illustrative partial array of I/O structures, like the one in FIG. 5, but adjusted to fit within a macro-level pitch constraint, according to various embodiments.

Some implementation environments include additional design constraints. For example, some I/O PHY layouts for ICs can have a standard pitch that does not match well with a perfect S&T layout, like the one in FIG. 5. FIG. 6 shows an illustrative partial array 600 of I/O structures 110, like the one in FIG. 5, but adjusted to fit within a macro-level pitch constraint 610 (e.g., a package wiring constraint), according to various embodiments. As described above, the S&T layout of FIG. 5 uses a consistent, 150 u spacing between all I/O structures 110, and a large multiple is needed to fit the 150 u (e.g., 150 microns) spacing into a 1,000 u (e.g., 1 millimeter) macro-level pitch constraint 610. Some embodiments can effectively squeeze or stretch the spacing in at least one dimension to fit the macro-level pitch constraint 610. Inset 650 illustrates one set of geometries that can preserve some of the 150 u spacings, while adjusting others to fit into 400 u blocks. In particular, each hexagon 630 can be squeezed in one dimension, so that each hexagon is 250 u wide, and each square 640 remains 150 u wide. Accordingly, a block of a hexagon 630 and square 640 together consumes 400 u. Five such 400 u blocks can fit into 2,000 u, such that a pattern can repeat every two-macro-level pitch spacing (i.e., a relatively small multiple). Such arrangements can be implemented in a standard 26-pair or 47-pair I/O PHY layout.

Figure 7:
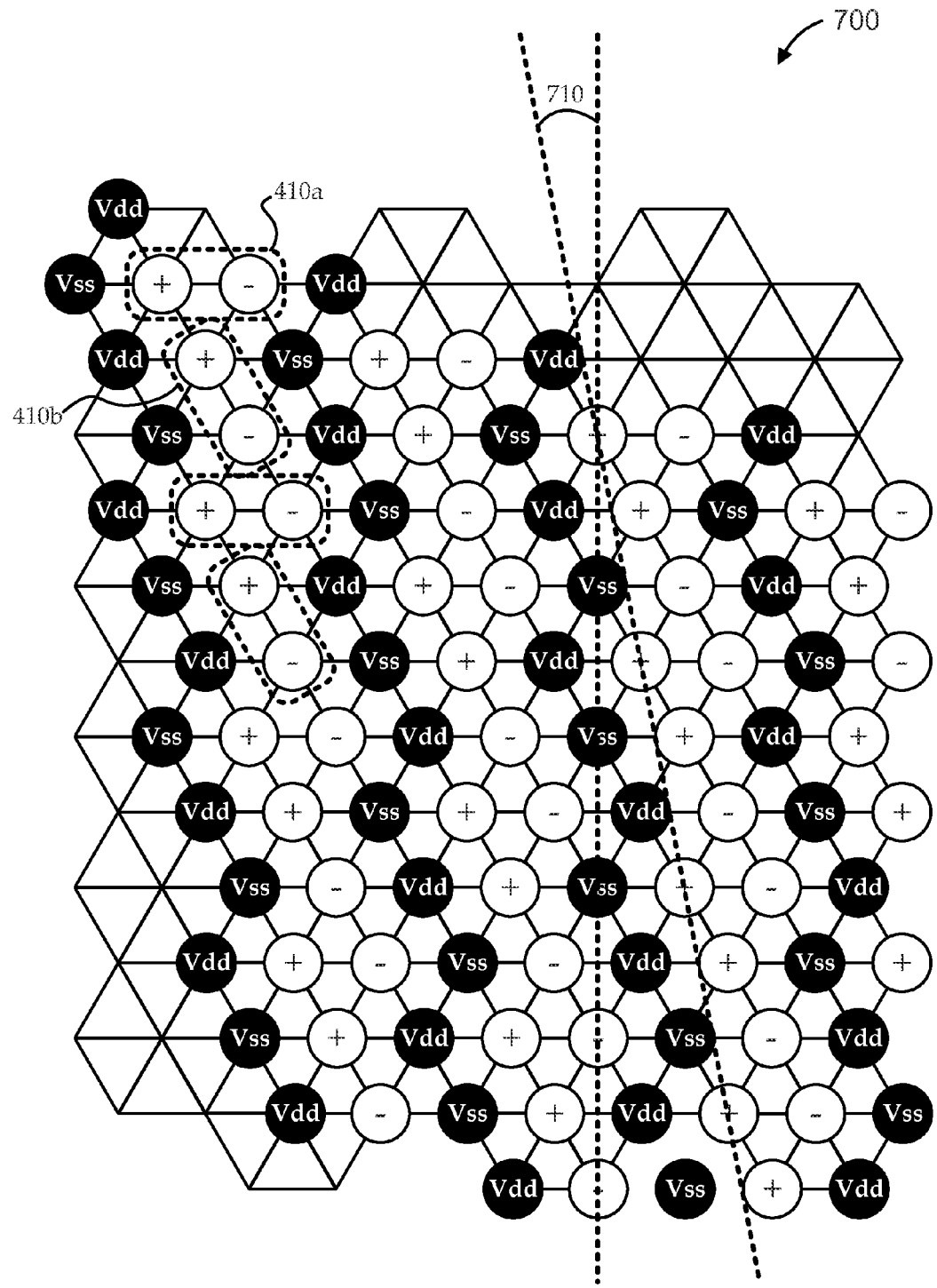
FIG. 7 shows an illustrative partial array of I/O structures that exploits a triangular quad geometry, arranged into signal chains separated by supply chains, according to various embodiments.

In some implementations, it can be desirable to avoid disrupting the consistency of the spacing (i.e., to avoid squeezing or stretching the layout, as in FIG. 6). FIG. 7 shows an illustrative partial array 700 of I/O structures 110 that exploits a triangular quad (TNQ) geometry, arranged into signal chains separated by supply chains, according to various embodiments. The TNQ geometry is similar to the PNQ geometry, except that adjacent differential pairs 410 form pairs of dipoles that are not quite perpendicular. In the particular implementation of FIG. 7, the TNQ geometry is designed so that, instead of spacing hexagons with squares, the entire array 700 can be formed with equilateral triangles (e.g., all having 150 u sides). For example, adjacent differential pairs 410 can be angled at 60-degrees relative to its neighbors. Such an approach can yield certain benefits, for example providing a completely uniform layout for epoxy under-fill fluid flow purposes, etc. However, such approaches can also provide less noise cancellation (e.g., because of the slightly asymmetric geometry). Further, as illustrated, such an approach manifests a macro-level shift over the array. For example, the 60-degree offsets between differential pairs 410 can manifest an 11-degree shift.

Figure 8:
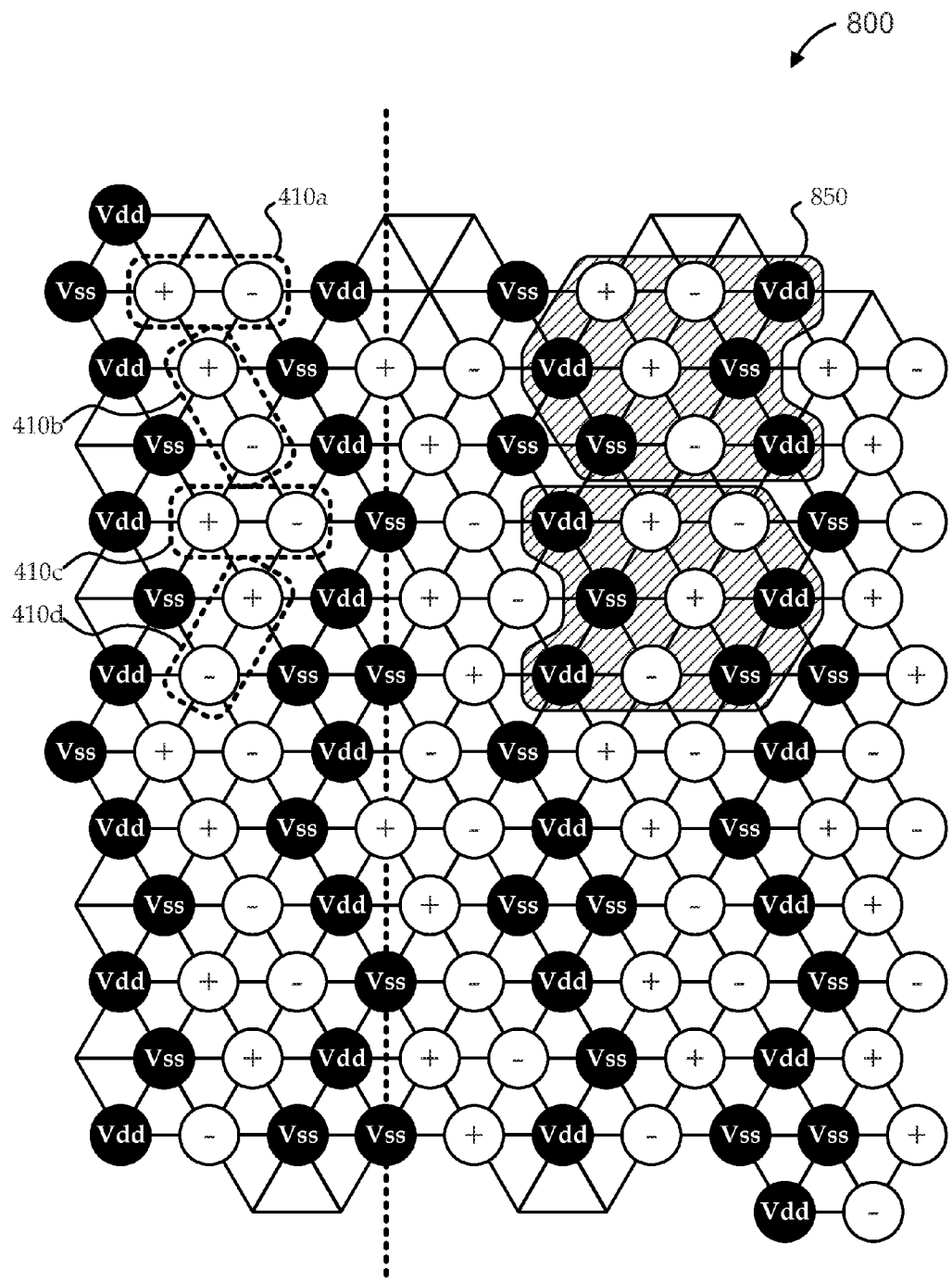
FIG. 8 shows another illustrative partial array of I/O structures that exploits a triangular quad geometry, like the one in FIG. 7, but using a zigzagging pattern to better parallelize the chains, according to various embodiments.

FIG. 8 shows another illustrative partial array 800 of I/O structures 110 that exploits a triangular quad (TNQ) geometry, like the one in FIG. 7, but using a zigzagging pattern to better parallelize the chains, according to various embodiments. For example, as in FIG. 7, differential pair 410b is off-perpendicular with respect to differential pair 410a by sixty degrees. However, unlike in FIG. 7, the differential pair 410d is off-perpendicular with respect to differential pair 410c by negative sixty degrees, thereby offsetting the shift between differential pair 410a and differential pair 410b. As illustrated, the arrangement forms blocks 850, each having a TNQ (i.e., two differential pairs 410) and five supply structures 110s.

In some implementations, the triangles can be slightly stretched in one dimension to match a standard macro-level pitch constraint (e.g., a package wiring constraint). For example, instead of using equilateral triangles having 150 u sides (such that each triangle has a height of approximately 129.9 u), some implementations use isosceles triangles having one 150 u side and two 153 u sides (such that each triangle has a height of approximately 133.4 u). The 133.4 u spacing allows fifteen triangles to fit in 2,000 u, such that a pattern can repeat every two-macro-level pitch spacing (i.e., a relatively small multiple). Such arrangements can be implemented in a standard 26-pair or 47-pair I/O PHY layout.

The above arrangements are intended to show some of the possible array layouts using PNQ or TNQ geometries, though many other implementations are possible. For example, some implementations apply a PNQ geometry to a ball grid array (BGA) layout, which can be constrained to have its I/O structures fall on a uniform-pitch, square array. One implementation orients parallel signal chains of PNQs at 45 degrees to the BGA pattern, separating each signal chain with a supply chain. Such an arrangement can effectively form blocks having four supply structures for each PNQ (i.e., approximately 50% of the BGA is assigned to supply). As described above, the combination of PNQ geometry and supply structure shielding can manifest near total noise cancellation. Further, in such an arrangement, bump spacing can be uniform (e.g., uniformly 150 u center-to-center), which can provide uniform flow of epoxy underfill stress relief.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The functions described may be implemented in hardware, software, firmware, or any combination thereof. If implemented in software, the functions may be stored as one or more instructions on a tangible computer-readable medium. A storage medium may be any available tangible medium that can be accessed by a computer. By way of example, and not limitation, such computer-readable media can comprise RAM, ROM, EEPROM, CD-ROM, or other optical disk storage, magnetic disk storage, or other magnetic storage devices, or any other tangible medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

A computer program product may perform certain operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Further, modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a CD or floppy disk, etc.), such that a user terminal and/or base station can obtain the various methods upon coupling or providing the storage means to the device. Moreover, any other suitable technique for providing the methods and techniques described herein to a device can be utilized.

Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples. Even further, real world structures are described and claimed herein, and such structures are manufactured within real world (practical) tolerances, etc. Accordingly, terms such as "equidistant," "perpendicular," and the like are intended to be construed within their respective tolerances and contexts, as would be appreciated by one of skill in the art.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. An integrated circuit comprising:
   a two-dimensional arrangement of input/output (I/O) structures, including:
   first and second I/O structures that are adjacent to each other and are electrically coupled with the integrated circuit so as to jointly carry a first differential signal; and
   third and fourth I/O structures that are adjacent to each other and are electrically coupled with the integrated circuit so as to jointly carry a second differential signal,
   the third and fourth I/O structures being adjacent to and equidistant from the second I/O structure, and
   each of the third and fourth I/O structures being non-adjacent to the first I/O structure and further from the first I/O structure than from the second I/O structure.

2. The integrated circuit of claim 1, wherein a distance between the first and second I/O structures is different from a distance between the third and fourth I/O structures.

3. The integrated circuit of claim 1, wherein the third and fourth I/O structures are equidistant from the first I/O structure.

4. The integrated circuit of claim 1, wherein:
   a first axis runs through respective centers of the first and second I/O structures;
   a second axis runs through respective centers of the third and fourth I/O structures.

5. The integrated circuit of claim 4, wherein each of the third and fourth I/O structures is equidistant from the first axis.

6. The integrated circuit of claim 4, wherein the respective centers of the second, third, and fourth I/O structures form vertices of a near-equilateral triangle.

7. The integrated circuit of claim 1, wherein the arrangement is a first of a plurality of arrangement instances, the plurality of arrangement instances arranged to form a chain, such that, for any first and second adjacent arrangement instance, the third and fourth I/O structures of the first arrangement instance are equidistant from the first I/O structure of the second arrangement instance.

8. The integrated circuit of claim 7, wherein the first and second I/O structures of the plurality of arrangement instances all lie on a common axis.

9. The integrated circuit of claim 7, wherein the chain is a first of a plurality of chain instances arranged as signal rows of an array of I/O structures.

10. The integrated circuit of claim 9, wherein each signal row is shifted with respect to its adjacent signal rows, such that, for any first and second adjacent signal rows, the first and second I/O structures of each arrangement instance of the first signal row are adjacent to the third and fourth I/O structures of each arrangement instance of the second signal row.

11. The integrated circuit of claim 9, wherein a first of the signal rows and a second of the signal rows are separated by a supply row comprising supply structures.

12. The integrated circuit of claim 11, wherein the supply row comprises a plurality of positive supply structures and negative supply structures arranged in an alternating sequence.

13. The integrated circuit of claim 11, wherein:
   at least some of the signal rows are each arranged, along with adjacent supply rows, to comprise a plurality of unit cells, each unit cell comprising the first, second, third, and fourth I/O structures of a respective arrangement instance of the signal row and at least three supply structures of the adjacent supply rows, the at least three supply structures comprising at least one positive supply structure and at least one negative supply structure.

14. The integrated circuit of claim 13, wherein:
the first and second I/O structures and a first and second of the at least three supply structures are adjacent to each other and form a square; and
the first and second I/O structures and a third of the at least three supply structures are adjacent to each other and form an isosceles triangle,
such that the lengths of the sides of the square are equal to the lengths of the sides of the triangle.

15. The integrated circuit of claim 13, wherein:
each unit cell comprises at least two positive supply structures and at least two negative supply structures; and
distances between any one of the I/O structures or supply structures of the unit cell to any adjacent one of the I/O structures or supply structures of the unit cell are equal.

16. The integrated circuit of claim 1, further comprising:
a plurality of circuits that generates a plurality of signals including the first and second differential signals, the plurality of circuits instantiated on a substrate integrated with a package.

17. The integrated circuit of claim 1, wherein each of the I/O structures is selected from a group consisting of an I/O pin, an I/O bump, a ball grid array (BGA) element, and an I/O via.

18. An integrated circuit comprising:
a package;
a plurality of circuits integrated into the package and disposed to communicate a plurality of differential signals; and
a two-dimensional array of vertical input/output (I/O) structures integrated with the package and the circuits, the array comprising signal rows of arrangement instances, each arrangement instance comprising:
first and second I/O structures that are adjacent to each other and are electrically coupled with the plurality of circuits so as to jointly communicate a first of the differential signals; and
third and fourth I/O structures that are adjacent to each other and are electrically coupled with the plurality of circuits so as to jointly communicate a second of the differential signals,
the third and fourth I/O structures being adjacent to and equidistant from the second I/O structure, and
each of the third and fourth I/O structures being non-adjacent to the first I/O structure and further from the first I/O structure than from the second I/O structure.

19. The integrated circuit of claim 18, wherein the first and second I/O structures lie on a first axis, the third and fourth I/O structures lie on a second axis, and the first axis bisects the second axis.

20. The integrated circuit of claim 18, wherein at least first and second adjacent signal rows are separated by a supply row of positive supply structures and negative supply structures.

* * * * *